(12) United States Patent
Nebendahl

(10) Patent No.: US 10,732,352 B2
(45) Date of Patent: Aug. 4, 2020

(54) CONTINUOUSLY TUNABLE OPTICAL FILTER

(71) Applicant: Keysight Technologies, Inc., Santa Rosa, CA (US)

(72) Inventor: Bernd Nebendahl, Ditzingen (DE)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/245,871

(22) Filed: Jan. 11, 2019

(65) Prior Publication Data

US 2019/0293872 A1 Sep. 26, 2019

Related U.S. Application Data

(60) Provisional application No. 62/646,689, filed on Mar. 22, 2018.

(51) Int. Cl.
| | |
|---|---|
| *G02B 6/293* | (2006.01) |
| *H04B 10/572* | (2013.01) |
| *G02B 6/35* | (2006.01) |
| *H01S 3/00* | (2006.01) |
| *H01S 3/13* | (2006.01) |

(52) U.S. Cl.
CPC ..... *G02B 6/29338* (2013.01); *G02B 6/29364* (2013.01); *G02B 6/3588* (2013.01); *H01S 3/0078* (2013.01); *H01S 3/1305* (2013.01); *H04B 10/572* (2013.01)

(58) Field of Classification Search
None
See application file for complete search history.

(56) References Cited

U.S. PATENT DOCUMENTS

| | | |
|---|---|---|
| 7,327,911 B2 | 2/2008 | Piede et al. |
| 7,639,723 B2 | 12/2009 | Yamazaki |
| 9,057,839 B2 | 6/2015 | Rasras |
| 9,127,983 B1 | 9/2015 | Cox et al. |
| 9,310,562 B2 | 4/2016 | Zheng et al. |

(Continued)

OTHER PUBLICATIONS

Jonathan A. Cox, "Control of integrated micro-resonator wavelength via balanced homodyne locking," Optics Express, May 5, 2014, vol. 22, No. 9., pp. 11279-11289.

(Continued)

*Primary Examiner* — Michael Stahl

(57) ABSTRACT

A tunable filter device includes a wavelength dependent splitter; a tuning element that tunes a characteristic wavelength of the wavelength dependent splitter to a wavelength of an optical signal; and a first optical coupler that splits the optical signal into an input optical signal input to the wavelength dependent splitter and a reference optical signal, where a first output outputs a band stop filtered portion and a second output outputs a band pass filtered portion of the input optical signal. The device further includes a second optical coupler that combines the reference optical signal with the band stopped filtered portion to provide a coupled optical signal; a photodiode that provides at a photocurrent indicating a difference between the wavelength of the optical signal and the characteristic wavelength; and a control loop that provides a control signal for automatically tuning the characteristic wavelength based at least in part on the photocurrent.

20 Claims, 9 Drawing Sheets

(56) References Cited

U.S. PATENT DOCUMENTS

| | | | | |
|---|---|---|---|---|
| 9,653,882 B1* | 5/2017 | Zheng | ................ | H01S 5/142 |
| 2010/0086261 A1* | 4/2010 | Tanaka | ............ | G02B 6/12007 |
| | | | | 385/88 |
| 2013/0134302 A1* | 5/2013 | Sato | ............. | H04B 10/07955 |
| | | | | 250/216 |

OTHER PUBLICATIONS

David A.B. Miller, "Perfect Optics with Imperfect Components," Optica, vol. 2, No. 8 (Aug. 2015), pp. 747-750.

* cited by examiner

CONTINUOUSLY TUNABLE OPTICAL FILTER

CROSS-REFERENCE TO RELATED APPLICATION

The present application claims priority under 35 U.S.C. § 119(e) to U.S. Provisional Application No. 62/646,689 filed on Mar. 22, 2018. The entire disclosure of U.S. Provisional Application No. 62/646,689 is specifically incorporated herein by reference.

BACKGROUND

A tunable laser has a wavelength of operation of the laser light (optical signal) that may be altered during operation. A tunable laser typically requires a tunable filter that selects one of the possible longitudinal modes (mode selection filter) of an optical cavity of the tunable laser. In bulk optic designs, this mode selection filter is built using a reflection grating in first order (e.g., Littman-Metcalf or Littrow geometry). The mode selection filter serves basically two purposes. First, it first allows longitudinal single mode operation, as it increases losses for all other modes to an extent, to yield a good side mode suppression ratio (SMSR). Second, the mode selection filter filters out unwanted spontaneous source emission of a gain medium in the optical cavity when used such that the light coupled out of the optical cavity passes through the mode selection filter at least once.

For a continuously tunable laser, the oscillating wavelength of light in the optical cavity and the filter wavelength of the tunable filter need to match always. In bulk optical external cavity lasers using Littman-Metcalf or Littrow geometry, for example, such matching may be achieved by proper mechanical design and alignment of the optical cavity elements. However, it is difficult to maintain this condition over time, due in part to variations of ambient temperature and wavelength. Hence, additional alignment actors are typically incorporated that are either driven by calibration values or by sensors that measure the deviation of the tunable filter wavelength versus the lasing wavelength. The additional alignment may include passive alignment or active alignment taking advantage of a sensor. The tunable filter can be used independently from the tunable laser as "clean-up filter" to remove unwanted spontaneous source emissions from the laser signal.

Conventional tunable lasers generally use a bulk optical filter or a filter that is not operated in closed loop (thus, operated in open loop mode). Using bulk optical filters leads to large and expensive optics with a number of design disadvantages, such as lower speed, sensitivity to vibration and environmental change, large footprint, and high cost due to expensive parts and extensive labor to obtain alignment. Operating the bulk optical filter in open loop mode requires a calibration of the filter wavelength, which needs to be stable over time and in various environmental conditions. Depending on the design, these requirements may be impossible or at least very difficult to fulfill. Also, there is the risk that the optical filter is not operated at the correct wavelength, leading to higher losses inside the optical cavity, which in turn leads to worsening SMSR, higher spontaneous source emission, and lower output power, or worse, the laser operation is blocked. For wideband tuning, a higher cavity loss also leads to a smaller tuning range since the gain of the gain medium is lower at the upper and lower wavelength ends of the gain profile that must compensate for the cavity losses.

What is needed, therefore, is a tunable optical filter that is efficiently and continuously tunable, such that resonance of the tunable optical filter is tuned such that the tunable optical filter is in resonance with an input optical signal to be filtered within the optical cavity.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
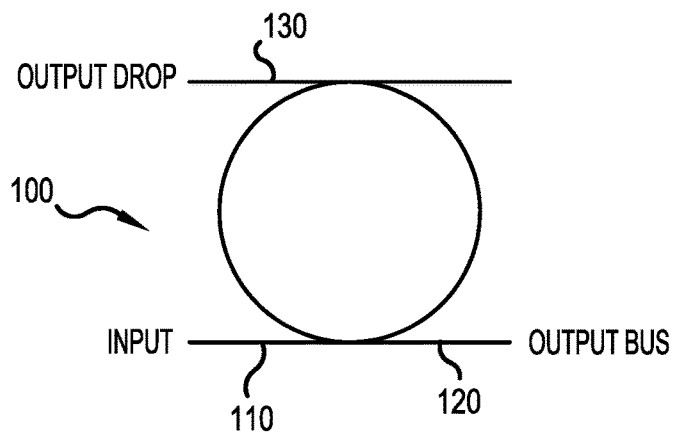
FIG. 1 is a schematic diagram of a ring filter.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

Unless otherwise noted, when a first element (e.g., a signal transmission line) is said to be connected to a second element (e.g., another signal transmission line), this encompasses cases where one or more intermediate elements (e.g., an electrical connector) may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," may be used to describe the various elements" relationships to one another, as illustrated in the accompanying drawings. These relative terms are intended to encompass different orientations of the elements thereof in addition to the orientation depicted in the drawings. For example, if an apparatus (e.g., a semiconductor package or coaxial cable) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

For a tunable laser using integrated optics, measuring deviation of the filter wavelength from the lasing wavelength using traditional bulk optic methods is not applicable since it relies on measurement of the geometrical angle of light reflected from the reflection grating. Such a measurement element does not exist in integrated optics. However, ring filters may be used to fulfill the needs of a tunable filter for mode selection. According to various embodiments, tunable ring filters are locked to the wavelength of the light (optical signal) that is going through a tunable filter without the need of any modulation of the wavelength of the light or the filter wavelength, which would lead to unwanted modulation on the output power and eventually the wavelength of the output laser light.

FIG. 1 is a schematic diagram of a ring filter, which may be more generally referred to as a wavelength dependent splitter. Referring to FIG. 1, ring filter 100 has an input 110, an output bus 120 and an output drop 130. The input 110 receives an input optical signal, which is split by the ring filter 100 between the output bus 120 with a band stop characteristic (band stop filtering) and the output drop 130 with a band pass characteristic (band pass filtering). The output bus 120 provides a bus (first) output optical signal, and the output drop 130 provides a drop (second) output optical signal.

Figure 2A:
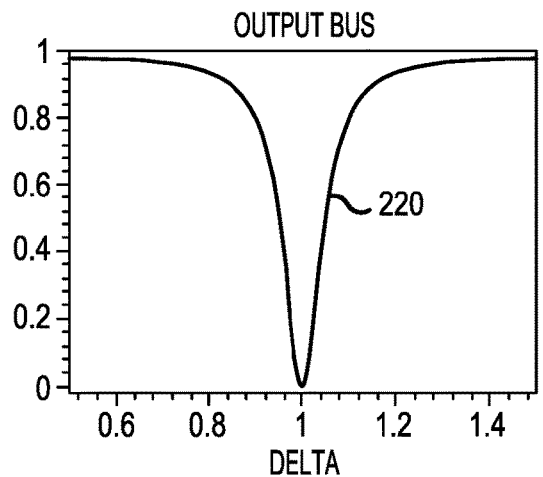
FIG. 2A is a graph showing output bus characteristics of a ring filter responsive to wavelength of an input optical signal.
Figure 2B:
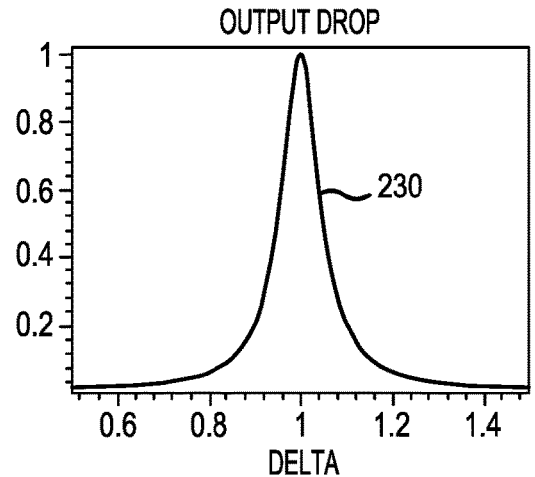
FIG. 2B is a graph showing output drop characteristics of a ring filter responsive to wavelength of an input optical signal.

The characteristic wavelength (or filter wavelength) of the ring filter 100 is the wavelength of the maximum of the wavelength dependent ratio of the input optical power of the optical signal at the input port 100 and the output optical power of the optical signal at the output drop port 130. This wavelength dependent ratio is also shown in FIG. 2B, where the characteristic wavelength is indicated by "1." That is, generally, the ratio of the optical power of the input signal and the optical power of the output signal is a function of the wavelength of the input optical signal. The characteristic wavelength is a function of the geometry and propagation speed of light in the filter waveguides. The propagation speed is a function of temperature and wavelength, but not of the input power (e.g., at least when nonlinear effects like self-heating are disregarded).

A portion of the input optical signal passing from the input 110 through the ring filter 100 and output at the output drop 130 is band pass filtered by the ring filter 100, as shown in FIG. 2B. Thus, the drop output optical signal comprises a band pass filtered output optical signal. A portion of the input optical signal output by the ring filter 100 at the output bus 120 is band stop filtered by the ring filter 100, as shown in FIG. 2A. Thus, the bus output optical signal comprises a band stop filtered (or "reflected") output optical signal. As mentioned above, the ring filter 100 has a tunable characteristic wavelength, and when the ring filter 100 is tuned to match the wavelength of the input optical signal, the band stop filtered output optical signal at the output bus 120 is essentially zero. This means that the entire input optical signal is band pass filtered by the ring filter 100, and output as the drop output optical signal at the output drop 130, as mentioned above.

To lock the characteristic wavelength of the tunable ring filter 100 to the wavelength of the input optical signal, a signal is generated, as discussed below, which may be a substantially odd function of the difference between the wavelength of the input optical signal and the characteristic wavelength of the ring filter 100, where the signal tunes the ring filter 100 by adjusting the characteristic wavelength. Ideally, the signal is directly proportional to the difference in wavelengths, at least in a region where the difference approaches zero. In order to generate such a signal, the characteristics of the ring filter 100 are considered.

FIG. 2A is a graph showing output bus (band stop) characteristics of the ring filter responsive to wavelength of an input optical signal, and FIG. 2B is a graph showing output drop (band pass) characteristics of the ring filter responsive to wavelength of the input optical signal. For example, the characteristics of the ring filter 100 lead to a periodic filter function that provides output bus signals on the output bus 120 and output drop signals on the output drop 130 indicated by curves 220 and 230 shown in FIGS. 2A and 2B, respectively, where "1" indicates the center wavelength or characteristic wavelength of the ring filter 100. Thus, the ring filter 100 effectively is a band stop filter as viewed from the output bus 120, indicated by curve 220, and effectively is a band pass filter as viewed from the output drop 130, indicated by curve 230. As discussed below, an error signal may be generated that indicates how far and in what direction the wavelength delta, between the wavelength of input optical signal and the characteristic wavelength of the ring filter 100, deviates from the nominal value of 1. This error signal may be used to tune the ring filter 100 to tune its characteristic wavelength until the error signal (i.e., indicative of the wavelength delta) is zero, in accordance with various embodiments.

Figure 3:
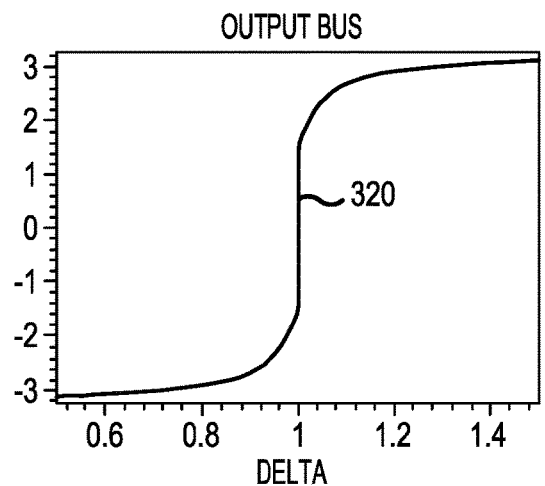
FIG. 3 is a graph showing phase characteristics of an output bus signal from a ring filter responsive to wavelength of an input optical signal.

FIG. 3 is a graph showing phase characteristics of the output bus signal from the ring filter responsive to wavelength of the input optical signal, corresponding to FIG. 2A. That is, FIGS. 2A and 2B show magnitudes of the band stopped and band passed optical signals at different wavelengths. However, there are also changes in phase connected to changes in magnitude. Both the magnitude and phase, e.g., of the bus output optical signal from the output bus 120, are connected through the Kramers-Kronig relation. Curve 320 in FIG. 3 depicts the phase of the bus output optical signal in comparison to a reference phase of a reference optical signal, discussed below, where "1" is a nominal wavelength value indicating the characteristic wavelength of the ring filter 100. The phase changes sign at the characteristic wavelength, such that phase is negative to the left of the wavelength value of 1 and positive to the right of the wavelength value of 1. To measure the phase, the bus output optical signal from the output bus 120 is beat with a fraction of the incoming optical signal, and detected using photo detectors, as discussed below.

Figure 4:
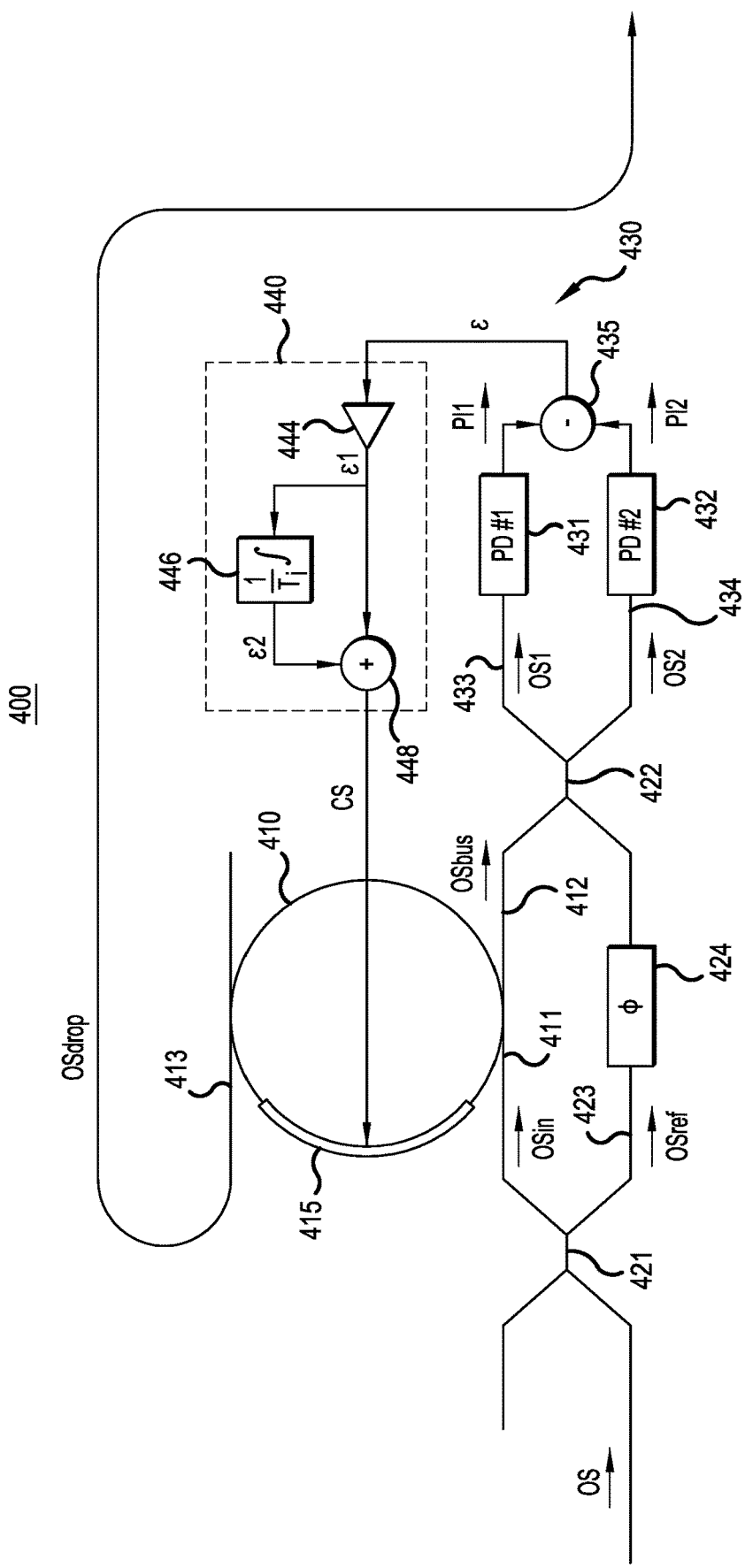
FIG. 4 is a schematic diagram of a tunable filter device including a ring filter for a tunable laser, according to a representative embodiment.

FIG. 4 is a schematic diagram of a tunable filter device for a tunable laser, according to a representative embodiment. The tunable filter device is located in an optical cavity of the tunable laser, for example.

Referring to FIG. 4, a tunable filter device 400 includes a ring filter 410 (an example of a wavelength dependent splitter) that has an input 411, an output bus (first output) 412 and an output drop (second output) 413. The input 411 may be an input optical waveguide, for example. The ring filter 410 has a characteristic wavelength corresponding to its maximum splitting ratio, as discussed above with reference to the ring filter 100. The tunable filter device 400 further includes a tuning element 415, which may be integrated with the ring filter 410. The tuning element 415 tunes the characteristic wavelength of the ring filter 410 to correspond to the maximum band pass filtered portion of the input optical signal by the ring filter 410.

In addition, the tunable filter device 400 includes a first optical coupler 421, which could be a 1×2 or 2×2 optical coupler, and a second optical coupler 422, which is a 2×2 optical coupler. The first optical coupler 421 splits an incoming optical signal OS, received by the tunable filter device 400 within the laser optical cavity, into an input optical signal OSin and a reference optical signal OSref. The optical signal OS may comprise a tunable laser signal, generated by a tunable laser, for example. The input optical signal OSin is input to the ring filter 410 via the input 411. The reference optical signal OSref passes through a reference arm (waveguide) 423 that may include a phase shifter 424 to phase shift the reference optical signal OSref relative to the input optical signal OSin, discussed below. In an embodiment, the first optical coupler 421 splits a small fraction of the optical signal OS into the reference arm 423, such that the majority of the optical signal OS enters the input 411 of the ring filter 410. For example, the fraction of the optical signal OS that enters the reference arm 423 may be less than 5 percent of the optical signal OS, although other fractions (e.g., less than 1 percent) may be incorporated without departing from the scope of the present teachings. The second optical coupler 422 combines the reference optical signal OSref with a bus (first) output optical signal OSbus, which is output from the output bus (waveguide) 412 of the ring filter 410, and provides first and second coupled optical signals OS1 and OS2 based on the combined optical signals. The second optical coupler 422 may be a 3 dB coupler, for example, although it is not limited thereto. Meanwhile, a filtered optical signal OSdrop is output from the output drop (waveguide) 413 of the ring filter 410 as the output of the tunable filter device 400. The filtered optical signal OSdrop may comprise the light coupled out of the optical cavity of the tunable laser.

Figure 5:
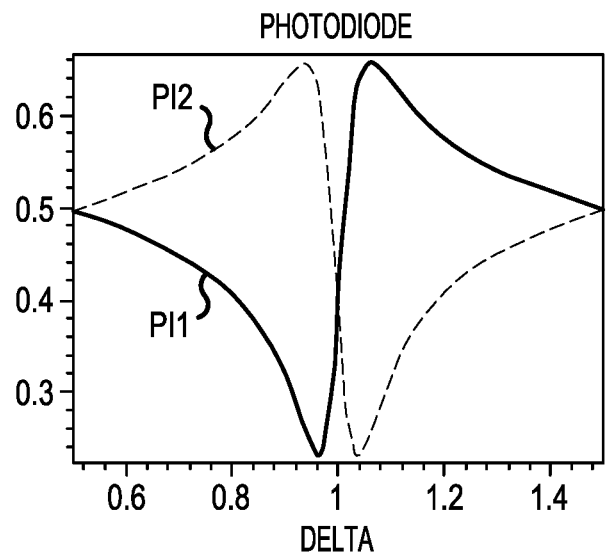
FIG. 5 is a graph showing photocurrent characteristics of the first and second photodiodes in response to input from the second coupler, according to a representative embodiment.

The tunable filter device 400 further includes a first photodiode 431 in a first arm (waveguide) 433 and a second photodiode 432 in a second arm (waveguide) 434 connected between the second optical coupler 422 and an adder 435. The first photodiode 431 is configured to detect the first coupled optical signal OS1 from a first output of the second optical coupler 422, and to provide a corresponding first photocurrent PI1. The first photocurrent PI1 indicates a difference between the wavelength of the optical signal OS and the characteristic wavelength of the ring filter 410. The second photodiode 432 is configured to detect the second coupled optical signal OS2 from a second output of the second optical coupler 422, and to provide a corresponding second photocurrent PI2. The second photocurrent PI2 also indicates a difference between the wavelength of the optical signal OS and the characteristic wavelength of the ring filter 410, but with opposite sign. Both the first and second photocurrents PI1 and PI2 are changing if the wavelength of the optical signal OS is changing with respect to the characteristic wavelength. However, the first photocurrent PI1 is increasing in the vicinity of "1," whereas the second photocurrent PI2 is decreasing, hence the difference (PI1−PI2) increases at about twice the rate (assuming the first and second photocurrents are behaving as shown in FIG. 5, discussed below).

As mentioned above, the phase shifter 424 in the reference arm 423 phase shifts the reference optical signal OSref relative to the phase of the input optical signal OSin. For example, FIG. 5 depicts illustrative first photocurrent PI1 and second photocurrent PI2 when the reference optical signal OSref has been phase shifted the proper amount. The proper amount of phase shifting to be performed by the phase shifter 424 is reached when the first and second photocurrents PI1 and PI2 versus wavelength have the same value at the characteristic wavelength of the ring filter 410.

The tunable filter device 400 has a control loop 430 that includes the adder 435 and a control circuit 440. The adder 435 is configured to determine a difference between the first photocurrent PI1 and the second photocurrent PI2, and to provide an error signal ε indicating the difference. The characteristic wavelength of the ring filter 410 is equal to the wavelength of the input optical signal OSin when the error signal ε output by the adder 435 is zero. For example, FIG. 5 depicts the illustrative first and second photocurrents PI1 and PI2 when the error signal ε is equal to zero.

The control circuit 440 is configured to provide a control signal CS in response to the error signal ε. That is, the control circuit 440 outputs the control signal CS based, at least in part, on each of the first photocurrent PI1 and the second photocurrent PI2, and comparison thereof. The control signal CS controls the tuning element 415 to tune automatically the characteristic wavelength of the ring filter 410, corresponding to the maximum band pass filtered potion of the input optical signal OSin, in order to reduce the difference between the wavelength of the input optical signal OSin and the characteristic wavelength. The control signal CS may be a voltage signal for controlling the tuning element 415, for example. Ideally, the tuning element 415 is controlled to tune the characteristic wavelength of the ring filter 410 until it is the same as the wavelength of the input optical signal OSin, as discussed above, at which point substantially all of input optical signal OSin is band pass filtered through the ring filter 410 to the output drop 413. Stated differently, the bus output optical signal OSbus from the output bus 412 of the ring filter 100 is substantially equal to zero when the tuned characteristic wavelength matches the wavelength of the optical signal OS, indicating the ring filter 410 is in tune. Thus, automatically tuning the characteristic wavelength may include continuously tuning the wavelength of the ring filter 410 via the tuning element 415 in response to the control signal CS, so that the tuned characteristic wavelength matches the wavelength of the optical signal OS.

In an embodiment, the control circuit 440 is a Proportional Integral (PI) controller configured to receive and process the error signal $\varepsilon$ indicating the difference between the wavelength of the optical signal OS and the characteristic wavelength, and to output the control signal CS in response. The PI controller includes an amplifier 444 that receives and amplifies the error signal $\varepsilon$, outputting amplified error signal $\varepsilon 1$. The PI controller further includes an integrating logic device 446 that performs an integration function on the amplified error signal £ 1 over time to provide an integrated error signal $\varepsilon 2$, and an adder 448 that adds the amplified error signal $\varepsilon 1$ and the integrated error signal $\varepsilon 2$ to output the control signal CS. In an embodiment, the PI controller may be replaced by a PID controller that also includes differentiating logic. Of course, the feedback control circuit 440 may include other types of control circuits, such as an on-off controller or controllers using fuzzy logic, without departing from the scope of the present teachings.

In an alternative embodiment, the tunable filter device 400 may include a storage device (not shown) for storing reference values of the ratio of the first photocurrent PI1 and/or the second photocurrent PI2 and the input power of the optical signal OS (input optical power) determined when the ring filter 410 is in resonance. The control circuit 440 is configured to provide the control signal CS, at least in part, by determining a difference between the value of the ratio of the first photocurrent PI1 provided by the first photodiode 431 (or the value of the second photocurrent PI2 provided by the second photodiode 432) and the input optical power and the stored respective reference value. In various embodiments, the input optical power may be determined using a pre-recorded relationship between pump current of the laser gain medium and the cavity power, or by measuring the input optical power using another coupler with another (third) photodiode.

Figure 6:
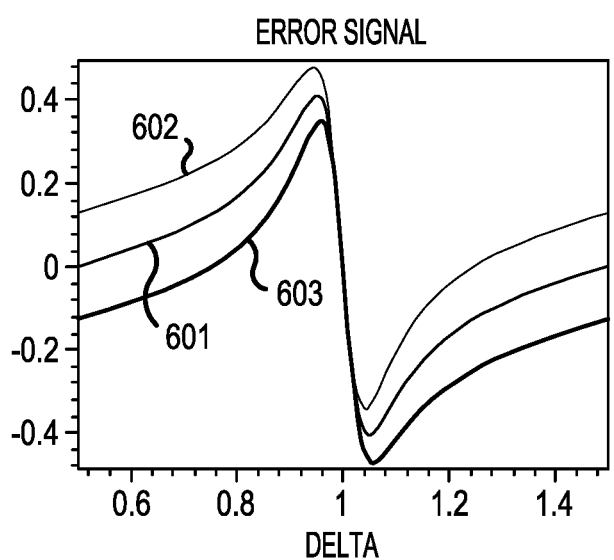
FIG. 6 is a graph showing error signals from subtraction of the first and second photodiodes, according to a representative embodiment.

FIG. 6 is a graph showing error signals resulting from subtraction of the photocurrents from the first and second photodiodes, according to a representative embodiment.

Referring to FIG. 6, "0" on the vertical axis indicates the ring filter 410 operating at resonance, and "1" on the horizontal axis indicates that the optical signal OS and the ring filter 410 are in resonance (i.e., the wavelength of the optical signal OS and the characteristic wavelength of the filter are equal). The different traces 601, 602 and 603 show dependency of the error signal $\varepsilon$ on the phase shift provided by the phase shifter 424 in the reference arm 423. For a proper range of phases, the error signal $\varepsilon$ changes sign at the characteristic wavelength of the ring filter 410. The traces 601, 602 and 603 correspond to three different phase shift values. The center trace 601 is the "ideal" phase choice, whereas the other two traces 602 and 603 correspond to a phase change that is slightly above or below the ideal value, respectively. FIG. 6 shows that the actual value of the phase shift does not affect the "working point" of the control circuit 440.

Figure 7:
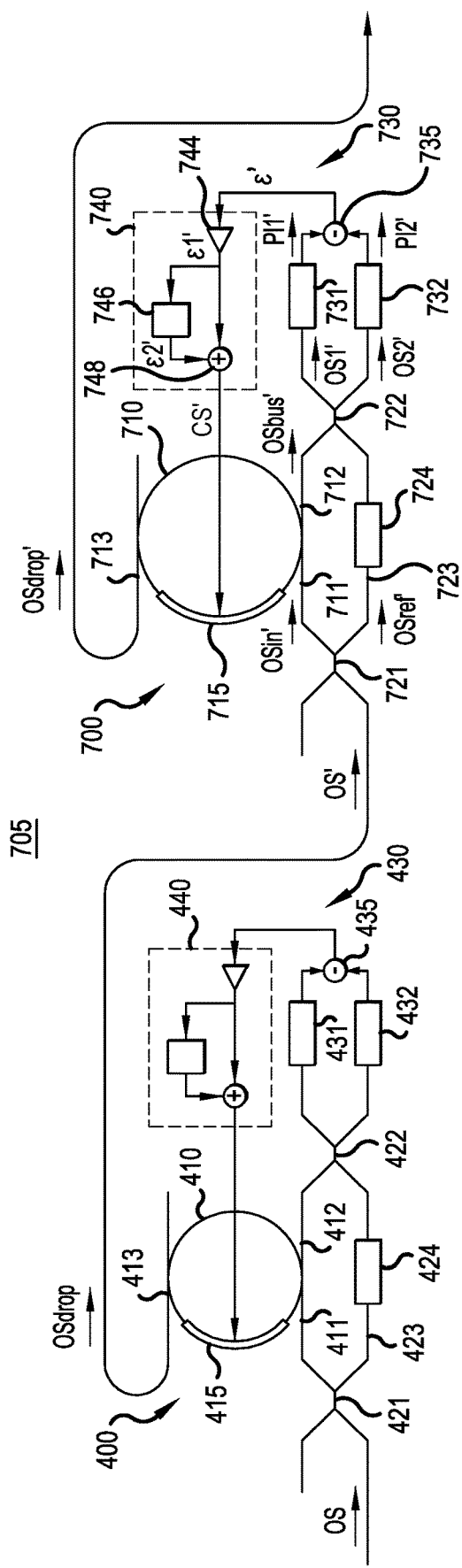
FIG. 7 is a schematic diagram of a tunable filter device including cascaded ring filters for a tunable laser, according to a representative embodiment.

FIG. 7 is a schematic diagram of a tunable cascaded filter device including cascaded ring filters for a tunable laser, according to a representative embodiment.

Referring to FIG. 7, a cascaded filter device 705 is included in a laser optical cavity of a laser device for filtering laser light (optical signals) being generated in the laser optical cavity. The cascaded filter device 705 includes tunable filter device 400 and tunable filter device 700, where a ring filter 710 (wavelength dependent splitter) of the tunable filter device 700 is cascaded with a ring filter 410 of the tunable filter device 400. For ease of explanation, the tunable filter device 400 and the ring filter 410 (which are the same as discussed above with reference to FIG. 4) may be referred to as the first tunable filter device 400 and the first ring filter 410, respectively, and the tunable filter device 700 and the cascaded ring filter 710 may be referred to as the second tunable filter device 700 and the second ring filter 710, respectively.

The first ring filter 410 and the second ring filter 710 have different diameters. In the depicted embodiment, the second ring filter 710 is slightly larger in diameter than the first ring filter 410, although the opposite configuration may be implemented with departing from the scope of the present teachings. The output drop 413 of the first ring filter 410 is connected to an input 711 of the second ring filter 710 via a first optical coupler 721. Accordingly, the filtered optical signal OSdrop from the first ring filter 410 is the cascade optical signal OS' of the second tunable filter device 700. Notably, the second tunable filter device 700 includes its own control loop 730, which operates independently of the control loop 430 in the first tunable filter device 400 (except to the extent the control loop 430 affects the filtered optical signal OSdrop output from the output drop 413).

The second ring filter 710 has an output bus (first output) 712 and an output drop (second output) 713, in addition to the input 711. The tunable filter device 700 further includes a tuning element 715, which may be integrated with the second ring filter 710. The tuning element 715 tunes a characteristic wavelength of the second ring filter 710 corresponding to the maximum band pass filtered portion of the input optical signal by the second ring filter 710.

In addition, the second tunable filter device 700 includes the first optical coupler 721, which could be a 1×2 or 2×2 optical coupler, and a second optical coupler 722, which is a 2×2 optical coupler. The first optical coupler 721 splits the optical signal OS' received from the output drop 413 of the first ring filter 410, as mentioned above, into an input optical signal OSin' and a reference optical signal OSref. The input optical signal OSin' is input to the second ring filter 710 via the input 711, and the reference optical signal OSref passes through a reference arm 723 that may include a phase shifter 724 to phase shift the reference optical signal OSref relative to the input optical signal OSin'. In an embodiment, the first optical coupler 721 splits a small fraction of the optical signal OS' into the reference arm 723. For example, the fraction of the optical signal OS' that goes into the reference arm 723 is less than 5 percent of the optical signal OS', although other fractions (e.g., less than 1 percent) may be incorporated without departing from the scope of the present teachings. The second optical coupler 722 combines the reference optical signal OSref with a bus (first) output optical signal OSbus', which is output from the output bus 712 of the second ring filter 710, and provides first and second coupled optical signals OS1' and OS2'. The second optical coupler 722 may be a 3 dB coupler, for example, although it is not limited thereto. Meanwhile, a filtered optical signal OSdrop' is output from the output drop 713 of the second ring filter 710 as the output of the cascaded filter device 705.

The second filter tunable device 700 further includes a first photodiode 731 and a second photodiode 732 connected between the second optical coupler 722 and an adder 735. The first photodiode 731 is configured to detect the first coupled optical signal OS1' from a first output of the second optical coupler 722, and to provide a corresponding first photocurrent PI1'. The first photocurrent PI1' indicates a difference between the wavelength of the optical signal OS' and the characteristic wavelength of the ring filter 710. The second photodiode 432 is configured to detect the second coupled optical signal OS2' from a second output of the second optical coupler 722, and to provide a corresponding second photocurrent PI2'. The second photocurrent PI2' indicates a difference between the wavelength of the optical signal OS' and the characteristic wavelength of the second ring filter 710.

As mentioned above, the phase shifter 724 phase shifts the reference optical signal OSref relative to the input optical signal OSin'. The proper amount of phase shift of the reference optical signal OSref results in complementary current signals on the first and second photodiodes 731 and 732, as discussed above with reference to FIGS. 4 and 5.

The second tunable filter device 700 has a control loop 730 that includes the adder 735 and a control circuit 740. The adder 735 is configured to determine a difference between the first photocurrent PI1' and the second photocurrent PI2', and to provide an error signal indicating the difference. The second ring filter 710 is in resonance when the error signal output by the adder 735 is equal to zero.

The control circuit 740 is configured to provide a control signal CS' to the tuning element 715 in response to the error signal ε'. That is, the control circuit 740 outputs the control signal CS' based, at least in part, on each of the first photocurrent PI1' and the second photocurrent PI2'. The control signal CS' controls the tuning element 715 to tune automatically the characteristic wavelength of the second ring filter 710 corresponding to the maximum band pass filtered portion of the input optical signal in order to reduce the difference between the wavelength of the input optical signal OSin' and the characteristic wavelength. The control signal CS' may be a voltage signal for controlling the tuning element 715, for example. Ideally, the tuning element 715 is controlled to tune the characteristic wavelength of the second ring filter 710 until it is the same as the wavelength of the input optical signal OSin', at which point substantially all of input optical signal OSin' is band pass filtered by the second ring filter 710 and output at the output drop 713. Stated differently, the bus output optical signal OSbus' from the output bus 712 is substantially equal to zero when the tuned characteristic wavelength matches the wavelength of the optical signal OS' (e.g., the optical signal OSdrop from the first ring filter 410), indicating the second ring filter 710 is in tune. That is, automatically tuning the characteristic wavelength may include continuously tuning the characteristic wavelength of the second ring filter 710 via the tuning element 715 in response to the control signal CS', so that the tuned characteristic wavelength matches the wavelength of the optical signal OS'.

As discussed above with regard to the control circuit 440, in an embodiment, the control circuit 740 may be a PI controller (or a PID controller, in various embodiments) configured to receive and process the error signal ε' indicating the difference between the wavelength of the input optical signal OSin' and the characteristic wavelength, and to output the control signal CS' in response. The PI controller includes an amplifier 744 that receives and amplifies the error signal ε', outputting amplified error signal ε1'. The PI controller further includes an integrating logic device 746, which performs an integration function on the amplified error signal ε1' over time to provide an integrated error signal ε2', and an adder 748, which adds the amplified error signal ε1' and the integrated error signal ε2' to output the control signal CS'.

Also, in an embodiment, the second tunable filter device 700 may include a storage device (not shown) for storing reference values of the ratio of first photocurrent PI1' and/or the second photocurrent PI2' and the input power of the optical signal OS' when the second ring filter 710 is in resonance. The storage device is accessed and used as discussed above with reference to the first filter device 400. The first and second tunable filter devices 400 and 700 may use the same or different storage devices without departing from the scope of the present teachings.

Generally, the (first) filter device 400 operating alone, as shown in FIG. 4, is sufficient when the wavelength range of interest is equal to or less than the free spectral range of the filter device 400. The free spectral range is defined by the spacing in optical wavelength (or frequency) between adjacent peaks of the periodic band pass function in optical intensity maxima. However, this sometimes is not the case. Thus, an advantage of the cascaded filter device 705 according to the embodiment of FIG. 7 is that, when the first and second ring filters 410 and 710 have slightly different diameters, as discussed above, the effective free spectral range of the cascaded filter device 705 is increased over that of the filter device 400 alone because the characteristic wavelengths of both the first and second ring filters 410 and 710 need to align to create transmission.

Figure 8:
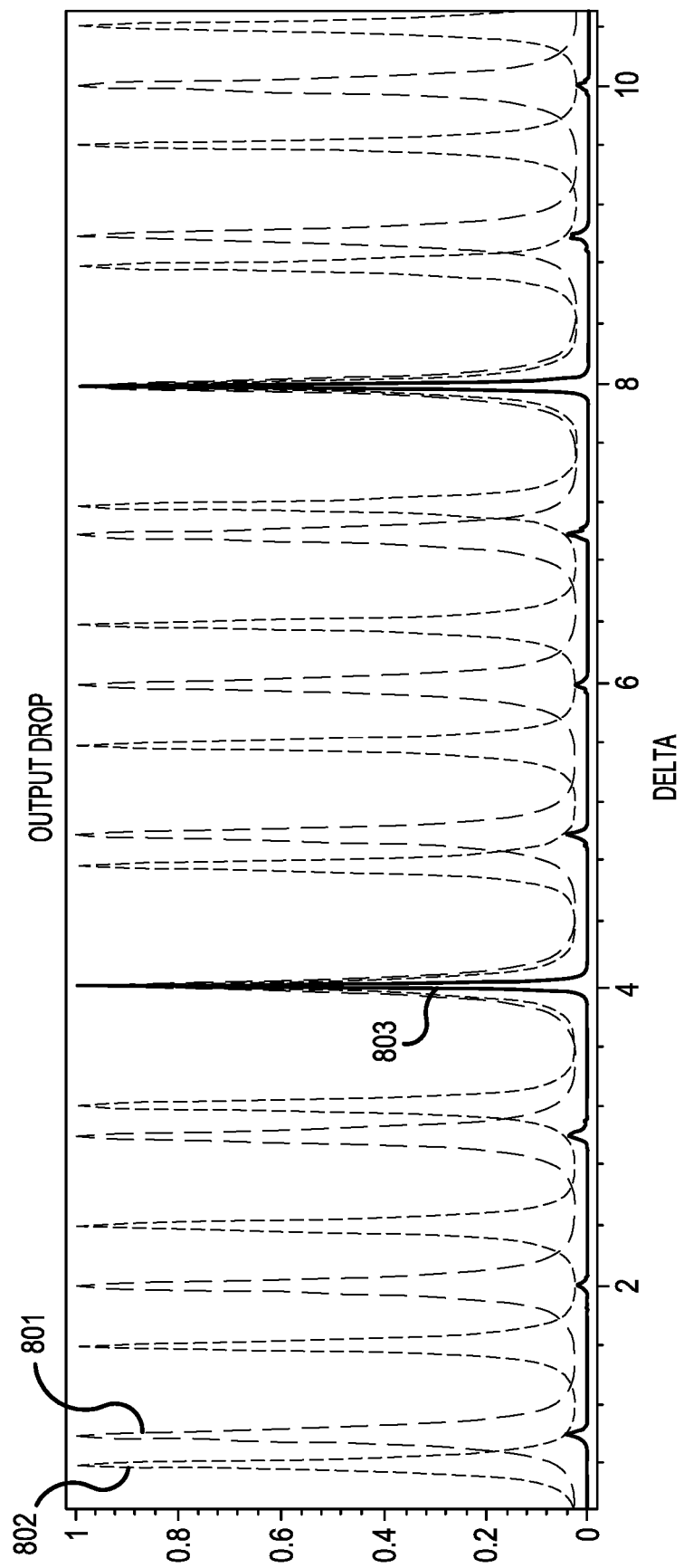
FIG. 8 is a graph showing optical intensity signals output by the individual ring filters and the cascaded ring filter of FIG. 7, according to a representative embodiment.

FIG. 8 is a graph showing optical intensity signals output by the individual filter devices and the cascaded filter device of FIG. 7, according to a representative embodiment.

Referring to FIG. 8, curve 801 indicates the individual optical intensity of the filtered optical signal OSdrop from the first ring filter 410 in the filter device 400, and curve 802 indicates the individual optical intensity of the filtered optical signal OSdrop' from the second ring filter 710 in the tunable filter device 700. Curve 803 indicates the combined optical intensity of the filtered optical signals OSdrop and OSdrop' from the first and second ring filters 410 and 710 as arranged in the cascaded filter device 705. The individual first and second ring filters 410 and 710 cannot be tuned substantially more than one free spectral range. Although it is still possible to combine any two of the periodic peaks of the curve 801 or the curve 802 for the first and second ring filters 410 and 710 to reach any wavelength in the free spectral range of the effective filter, it would then not be possible to continuously tune over the full free spectral range of the cascade. In comparison, the cascaded filter device 705 likewise cannot be tuned substantially more than one free spectral range of its individual filters. However, as shown by curve 803 in FIG. 8, the free spectral range between peaks of the cascaded filter device 705 is significantly larger than the free spectral range between peaks of either of the first ring filter 410 or the second ring filter 710, individually. In addition to the free spectral range of the cascaded filter device 705 being larger than the free spectral ranges of the first ring filter 410 or the second ring filter 710, the suppression is also better and the filter width (i.e., the passband) is smaller, as shown in FIG. 8.

The tuning of the cascaded filter device 705 is still limited to the tuning ranges of the individual filters, for example. If additional tuning is required (e.g., for use in a tunable laser), two identical cascaded filters may be operated in parallel filter banks, while alternating between the parallel filter banks. That is, while one cascaded filter device in one filter bank is being used and actively tuned, the other cascaded filter device in the parallel filter bank can be reset (i.e., tuned to the next free spectral range). Switches are used to switch between the filter banks, so that one is active and the other is being reset.

Figure 9:
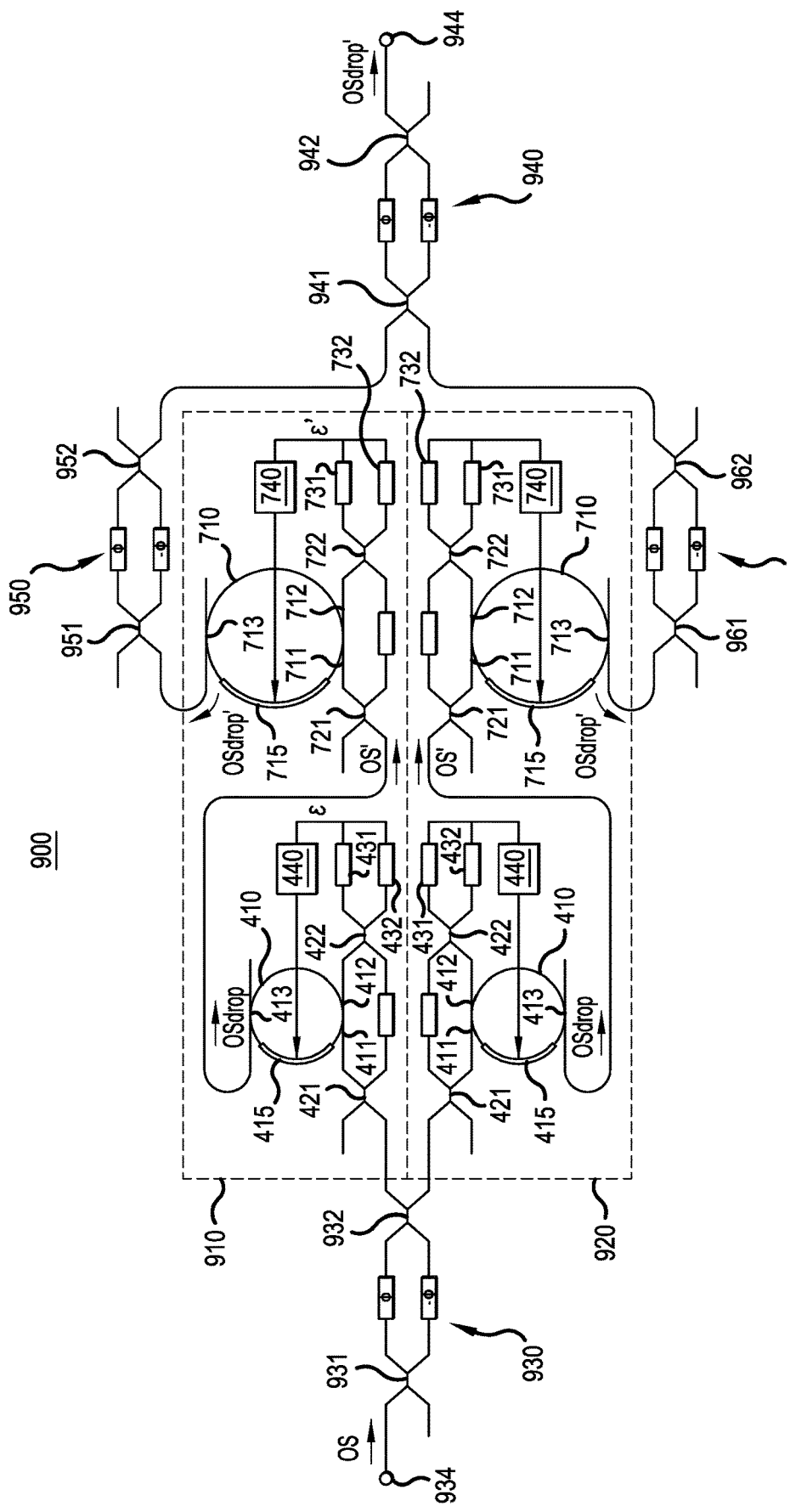
FIG. 9 is a schematic diagram of a tunable filter device including multiple filter banks of cascaded ring filters for a tunable laser, according to a representative embodiment.

FIG. 9 is a schematic diagram of a tunable filter device including multiple filter banks of cascaded ring filters for a tunable laser, according to a representative embodiment.

Referring to FIG. 9, a tunable filter device 900 includes multiple filter banks, depicted as representative first filter bank 910 and second filter bank 920. The first and second filter banks 910 and 920 are connected in parallel with one another between a first (input) optical switch 930 and a second (output) optical switch 940. The first optical switch 930 is configured to switch the optical signal OS, received at a filter input 934, between the first filter bank 910 and the second filter bank 920, effectively selecting the active filter bank. The second optical switch 940 is configured to switch to a filter output 944 the filtered optical signal OSdrop' output from the corresponding one of the first filter bank 910 and the second filter bank 920 to which the first optical switch 30 has switched the optical signal OS (i.e., the selected filter bank), such that a filtered signal from one of the first filter bank 910 and the second filter bank 920 is output from the tunable filter device 900.

The switching between the first and second filter banks 910 and 920 may be initiated by an overall system controller (not shown) that monitors the individual filter control circuits 440 and 740. When the tuning of one of the first filter bank 910 or the second filter bank 920 has reached its minimum or maximum tuning, the system controller operates the first and second optical switches 930 and 940 to route the optical signal OS to the other one of the first filter bank 910 or the second filter bank 920 (that has been reset in the meantime). This switching enables the one of the first filter bank 910 or the second filter bank 920 that has reached maximum or minimum tuning to then be reset. The system controller also operates the third and fourth optical switches 950 and 960 accordingly to block the filter output signals, respectively, of the first filter bank 910 or the second filter bank 920 that is being reset, as discssed below.

In various embodiments, the system controller may be included with the tunable filter device 900, or may be in a separate processor, computer, or other control unit. For example, the system controller may be implemented by a computer processor, application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a central processing unit (CPU), for example, executing an operating system. A memory (not shown) accessible by the controller 470 may be implemented by any number, type and combination of random access memory (RAM) and read-only memory (ROM), for example, and may store various types of information, such as computer programs and software algorithms executable by the controller 470 (and/or other components), as well as data and/or signals storage, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are tangible and non-transitory storage media (e.g., as compared to transitory propagating signals). The system controller may communicate with the first, second, third and fourth optical switches 930, 940, 950 and 960 by various means, including wired and wireless communications.

As mentioned above, the second filter bank 920 is reset when the optical signal OS is switched to the first filter bank 910, making the first filter bank 910 the active filter bank. Likewise, the first filter bank 910 is reset when the optical signal OS is switched to the second filter bank 920, making the second filter bank 920 the active filter bank. Resetting the first filter bank 910 or the second filter bank 920 means that the corresponding ring filters (first and second ring filters 410 and 710) are tuned to the next free spectral range, which is adjacent the free spectral range in which the active one of the first filter bank 910 or the second filter bank 920 is operating. If for example the characteristic wavelength of one of the ring filters (first or second ring filter 410 or 710) has reached its maximum, that ring filter is tuned to lower the characteristic wavelength until the maximum of the pass band that is next, when going up in wavelength, aligns with the maximum band pass filtered portion of the input optical signal by the other ring filter that has not yet reached its maximum tuning.

The tunable filter device 900 also includes a third (blocking) optical switch 950 and a fourth (blocking) optical switch 960. The third optical switch 950 is located at the output drop 713 of the ring filter 710 of the first filter bank 910, and the fourth optical switch 960 is located at the output drop 713 of the ring filter 710 of the second filter bank 920. The third optical switch 950 operates to block the output (filtered optical signal OSdrop') of the cascaded filter in the first filter bank 910 when the first filter bank 910 is not active (i.e., the first optical switch 930 and the second optical switch 940 are switched to the second filter bank 920), while the fourth optical switch 960 operates to all the output (filtered optical signal OSdrop') of the output drop 713 in the second filter bank 920 to pass to the second optical switch 940. Likewise, the fourth optical switch 960 operates to block the output (filtered optical signal OSdrop') of the cascaded filter in the second filter bank 920 when the second filter bank 920 is not active (i.e., the first optical switch 930 and the second optical switch 940 are switched to select the first filter bank 910), while the third optical switch 950 operates to allow the output (filtered optical signal OSdrop') of the output drop 713 in the first filter bank 910 to pass to the second optical switch 940. The third and fourth optical switches 950 and 960 thereby provide protection against leakage from the first and second filter banks 910 and 920 when they are not selected as the active filter bank.

In an embodiment, each of the first, second, third and fourth optical switches 930, 940, 950 and 960 are Mach-Zehnder interferometer (MZI) switches, for example. The MZI switches may perform switching operations by phase shifting the input optical signals on the upper and lower arms.

The first optical switch 930 comprises first optical coupler 931, which may be a 1×2 or 2×2 optical coupler, two phase shifters, and second optical coupler 932, which is a 2×2 optical coupler. The first optical switch 930 receives the optical signal OS through the first optical coupler 931, and provides the optical signal OS to the selected one of the first and second filter banks 910 and 920 through the second optical coupler 932. That is, one output port of the second optical coupler 932 is connected to the first filter bank 910, and the other output port of the second optical coupler 932 is connected to the second filter bank 920. The second optical switch 940 comprises third optical coupler 941, two phase shifters, and fourth optical coupler 942. The third optical coupler 941 is a 2×2 optical coupler, and the fourth optical coupler 942 may be a 1×2 or 2×2 optical coupler. The second optical switch 940 receives the filtered optical signal OSdrop' from the selected one of the first and second filter banks 910 and 920 through the third optical coupler 941, and provides the filtered optical signal OSdrop' to the filter output 944 through the fourth optical coupler 942. That is, one input port of the third optical coupler 941 is connected to the first filter bank 910, and the other input port of the third optical coupler 941 is connected to the second filter bank 920.

The third optical switch 950 comprises fifth optical coupler 951, two phase shifters, and sixth optical coupler 952. Each of the fifth and sixth optical couplers 951 and 952 may be a 1×2 or 2×2 optical coupler. The third optical switch 950 receives the filtered optical signal OSdrop' from the first filter bank 910, and outputs the filtered optical signal OSdrop' to the second optical switch 940 through the sixth optical coupler 952 when the first filter bank 910 is the active filter bank. Otherwise, the third optical switch 950 blocks any amount of the filtered optical signal OSdrop' that may be present at the fifth optical coupler 951 when the first filter bank 910 is not the active filter bank. The fourth optical switch 960 comprises seventh optical coupler 961, two phase shifters, and eighth optical coupler 962. Each of the seventh and eighth optical couplers 961 and 962 may be a 1×2 or 2×2 optical coupler. The fourth optical switch 960 receives the filtered optical signal OSdrop' from the second filter bank 920, and outputs the filtered optical signal OSdrop' to the second optical switch 940 through the eighth optical coupler 962 when the second filter bank 920 is the active filter bank. Otherwise, the fourth optical switch 960 blocks any amount of the filtered optical signal OSdrop' that may be present at the seventh optical coupler 961 when the second filter bank 920 is not the active filter bank.

Each of the first filter bank 910 and the second filter bank 920 is configured substantially the same as the cascaded filter device 705 discussed above with reference to FIG. 7. Therefore, the detailed description will not be repeated. Generally, though, when the first filter bank 910 is selected (by operation of the first and second optical switches 930 and 940), the corresponding first and second ring filters 410 and 710 are continuously tuned attempting to match the characteristic wavelength of the first ring filter 410 and the wavelength of the optical signal OS, and to match the characteristic wavelength of the second ring filter 710 and the wavelength of the filtered optical signal OSdrop output at the output drop 413 of the first ring filter 410. During this time, the (inactive) second filter bank 920 is reset, meaning that it is tuned to the next free spectral range, as discussed above. When the second filter bank 920 is selected (i.e., when the first filter bank 910 needs to be reset), the corresponding first and second ring filters 410 and 710 of the second filter bank 920 are continuously tuned attempting to match the characteristic wavelength of the first ring filter 410 and the wavelength of the optical signal OS, and to match the characteristic wavelength of the second ring filter 710 and the wavelength of the filtered optical signal OSdrop output at the output drop 413 of the first ring filter 410. During this time, the (inactive) first filter bank 910 is reset. Therefore, the operating or active one of the first and second filter banks 910 and 920 is always matching the wavelength of the optical signal OS. If the optical signal OS starts to change wavelength, the ring filters 410 and 710 of the active one of the first and second filter banks 910 and 920 starts to be tuned until one needs to be reset, in which case the one of the first and second filter banks 910 and 920 are switched. This operation will continue so that the ring filters 410 and 710 are constantly kept "on resonance."

Figure 10:
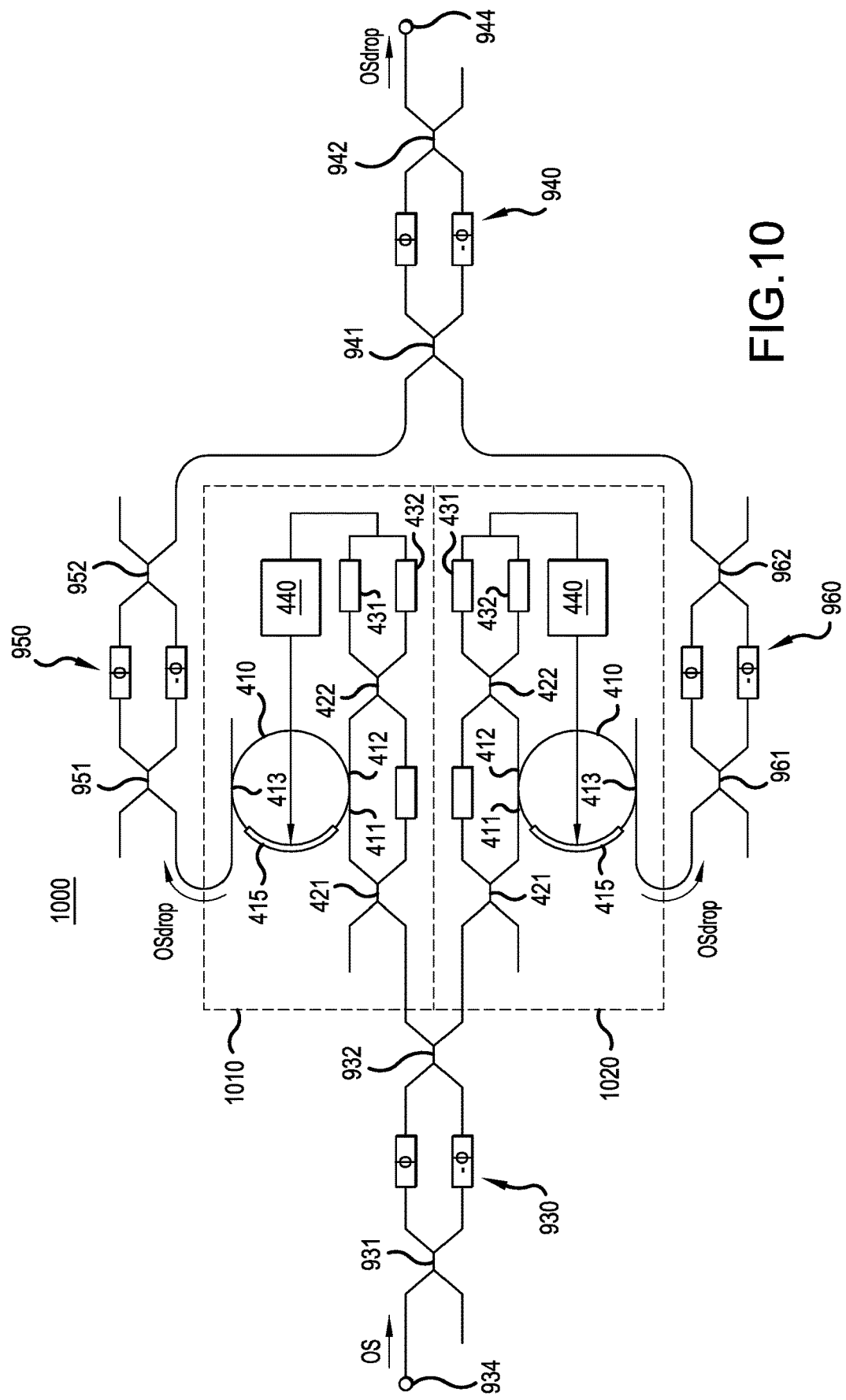
FIG. 10 is a schematic diagram of a tunable filter device including multiple filter banks of ring filters for a tunable laser, according to a representative embodiment.

FIG. 10 is a schematic diagram of a tunable filter device including multiple filter banks of ring filters for a tunable laser, according to a representative embodiment.

Referring to FIG. 10, a tunable filter device 1000 includes multiple filter banks, depicted as representative first filter bank 1010 and second filter bank 1020. The first and second filter banks 1010 and 1020 are connected in parallel with one another between first optical switch 930 and second optical switch 940, where the first optical switch 930 is configured to switch the optical signal OS, received at a filter input 934, between the first filter bank 910 and the second filter bank 920, effectively selecting the active filter bank, as discussed above. The second optical switch 940 is configured to switch to a filter output 944 the filtered optical signal OSdrop output from the corresponding one of the first filter bank 1010 and the second filter bank 1020 to which the first optical switch 930 has switched the optical signal OS (i.e., the selected filter bank). Thus, a filtered signal from one of the first filter bank 1010 and the second filter bank 1020 is output from the tunable filter device 1000.

Generally, the tunable filter device 1000 functions substantially the same as the tunable filter device 900 discussed above with reference to FIG. 9. The difference between the tunable filter devices 1000 and 900 is the layout of the first and second filter banks. The tunable filter device 1000 includes first and second filter banks 1010 and 1020, each having a single ring filter 410, which is substantially the same as the ring filter 410 discussed above with reference to FIG. 4. In comparison, the tunable filter device 900 includes first and second filter banks 910 and 920, each having cascaded first ring filter 410 and second ring filter 710, as discussed above. Otherwise, the first, second, third and fourth optical switches, and the corresponding optical couplers, are substantially the same as discussed above with reference to FIG. 9. This enables the second filter bank 1020 to be reset when the optical signal OS is switched to the first filter bank 1010, making the first filter bank 1010 the active filter bank. Likewise, the first filter bank 1010 is reset when the optical signal OS is switched to the second filter bank 1020, making the second filter bank 1020 the active filter bank. Resetting the first filter bank 1010 or the second filter bank 1020 means that the corresponding ring filters (ring filters 410) are tuned to the next free spectral range, which is adjacent the free spectral range in which the active one of the first filter bank 1010 or the second filter bank 1020 is operating.

Figure 11:
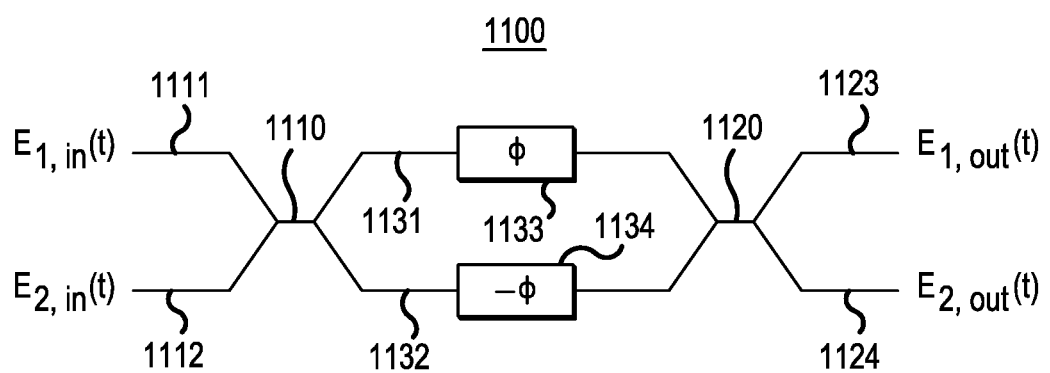
FIG. 11 is a schematic diagram of an optical switch, according to a representative embodiment.

FIG. 11 is a schematic diagram of an optical switch, according to a representative embodiment. Referring to FIG. 11, optical switch 1100 may be an MZI switch, and includes first optical coupler 1110, second optical coupler 1120, first switch waveguide 1131 with a first switch phase shifter 1133 and second switch waveguide 1132 with a second switch phase shifter 1134. Each of the first and second switch waveguides 1131 and 1132, with the corresponding first and second switch phase shifters 1133 and 1134, is connected between the first and second optical couplers 1110 and 1120. In the depicted embodiment, the first switch phase shifter 1133 shifts the phase of the optical signal by $\varphi$, and the second switch phase shifter 1134 shifts the phase of the optical signal by $-\varphi$. In this configuration, the optical switch 1100 effectively acts as a "cross-bar switch." Each of the tunable devices 900 and 1000 includes a number of optical switches, such as optical filters 930, 940, 950 and 960, each of which may be configured and implemented as optical switch 1100.

Notably, the optical switch 1100 uses two couplers with 50/50 coupling ratios (first and second optical couplers 1110 and 1120) and two phase shifter sections (first and second switch phase shifters 1133 and 1134). To build a reliable optical switch (e.g., with a high extinction ratio), each of the first and second optical couplers 1110 and 1120 has an exact 50/50 coupling ratio, splitting the optical signal in half. Optical couplers with exact 50/50 coupling ratios may be difficult to manufacture, particularly when intended to operate over a wide range of wavelengths. Therefore, as an alternative configuration, the optical switch may include three optical couplers instead of two, essentially mimicking a perfect optical switch regardless of the actual coupling ratios of the individual optical couplers, as discussed below.

Figure 12:
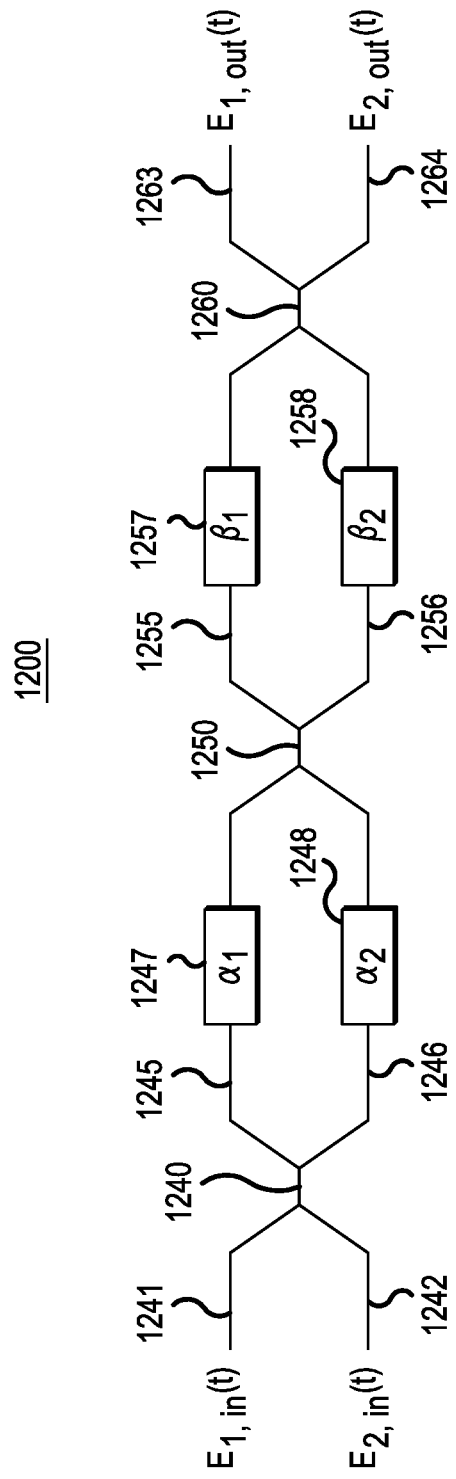
FIG. 12 is a schematic diagram of an optical switch, according to another representative embodiment.

FIG. 12 is a schematic diagram of an optical switch, according to another representative embodiment, including three optical couplers and four switch phase shifters. Referring to FIG. 12, optical switch 1200 likewise may be considered a MZI switch, with a modified configuration. The optical switch 1200 includes first optical coupler 1240, second optical coupler 1250 and third optical coupler 1260. A first switch waveguide 1245 with a first switch phase shifter 1247, and a second switch waveguide 1246 with a second switch phase shifter 1248, are arranged between the first optical coupler 1240 and the second optical coupler 1250. A third switch waveguide 1255 with a third switch phase shifter 1257, and a fourth switch waveguide 1256 with a fourth switch phase shifter 1258, are arranged between the second optical coupler 1250 and the third optical coupler 1260.

In the depicted embodiment, the first switch phase shifter 1247 shifts the phase of the optical signal by $\alpha 1$, and the second switch phase shifter 1248 shifts the phase of the optical signal by $\alpha 2$. Similarly, the third switch phase shifter 1257 shifts the phase of the optical signal by $\beta 1$, and the fourth switch phase shifter 1258 shifts the phase of the optical signal by $\beta 2$. The phase shift values $\alpha 1$, $\alpha 2$, $\beta 1$ and $\beta 1$ implemented by the first, second, third and fourth switch phase shifters 1247, 1248, 1257 and 1258, respectively, depend on the respective coupling ratios of the first, second and third optical couplers 1240, 1250 and 1260, as well as on the desired state of the optical switch 1200 (e.g., switch to either of output ports 1263 and 1264 or switch to some in between state). For example, the phase shift values may be determined experimentally for each switch assembly (the first and second switch phase shifters 1247, 1248 and the third and fourth switch phase shifters 1257, 1258) and operation wavelength due to wavelength dependence of the respective coupling ratios, as would be apparent to one skilled in the art. Generally, the phase shift values $\alpha 1$, $\alpha 2$, $\beta 1$ and $\beta 1$ of the first, second, third and fourth switch phase shifters 1247, 1248, 1257 and 1258, respectively, are determined such that a flat overall phase is maintained from input ports 1241 and 1242 to the respective output ports 1263 and 1264, while changing the switch state of the optical switch 1200. An example of determining phase shift values is provided by Miller, "Perfect Optics with Imperfect Components," Optica, Vol. 2, No. 8 (August 2015), p. 747, which is hereby incorporated by reference. In the depicted configuration, the optical switch 1200 effectively acts as a "cross-bar switch."

Each of the first, second and third optical couplers 1240, 1250 and 1260 of the optical switch 1200 is a 2×2 optical coupler. In comparison to the first and second optical couplers 1110 and 1120 in FIG. 11, none of the first, second and third optical couplers 1240, 1250 and 1260 needs to have a 50/50 coupling ratio (although a 50/50 coupling ratio may be included in any or all of the first, second and third optical couplers 1240, 1250 and 1260 without departing from the scope of the present teachings). That is, each of the first and second optical couplers 1110 and 1120 in FIG. 11 is an exact 50/50 splitter (providing a 50/50 coupling ratio) to provide an almost perfect switch that completely switches off one of output port 1123 or 1124. However, the configuration in FIG. 12 with the first, second and third optical couplers 1240, 1250 and 1260 is able to achieve almost perfect switching, completely switching off one of the output ports 1263 or 1264, even when the first, second and third optical couplers 1240, 1250 and 1260 are not exact 50/50 splitters. So, regardless of the actual coupling ratios of the first, second and third optical couplers 1240, 1250 and 1260, respectively, the optical switch 1200 is able to mimic a perfect optical switch.

In addition, the optical couplers in FIGS. 4, 7, 9 and 10 may be implemented using a basic optical switch, such as the optical switch 1100 shown in FIG. 11. The optical couplers include, for example, optical couplers 421 and 422 in FIGS. 4, 7, 9 and 10, and optical couplers 721 and 722 in FIGS. 7 and 9. Therefore, instead of providing the optical coupler 421, 422, 721 and 722 with a 50/50 coupling ratio, the optical switch 1100 may simply be tuned so that the phase sections (first and second switch phase shifters 1133 and 1134) are brought into an intermediate state so that the optical switch 1100 effectively acts as an optical coupler with an exact 50/50 coupling ratio.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A tunable filter device for filtering an optical signal, the filter device comprising:
a wavelength dependent splitter comprising an input, a first output, and a second output;
a tuning element that tunes a characteristic wavelength of the wavelength dependent splitter to a wavelength of the optical signal;
a first optical coupler configured to split the optical signal into (i) an input optical signal that is input to the wavelength dependent splitter via the input and (ii) a reference optical signal, wherein the first output outputs a band stop filtered portion of the input optical signal as a first output optical signal, and the second output outputs a band pass filtered portion of the input optical signal as a second output optical signal, which passes through the wavelength dependent splitter, and wherein the characteristic wavelength of the wavelength dependent splitter corresponds to a maximum of a wavelength dependent ratio of input optical power of the input optical signal and output optical power of the second output optical signal;
a second optical coupler configured to combine the reference optical signal with the first output optical signal to provide at least a first coupled optical signal;
a first photodiode configured to detect the first coupled optical signal provided by the second optical coupler and to provide a corresponding first photocurrent, the first photocurrent indicating a difference between the wavelength of the optical signal and the characteristic wavelength of the wavelength dependent splitter; and
a control loop configured to provide a control signal, based at least in part on the first photocurrent, for controlling the tuning element to automatically tune the characteristic wavelength of the wavelength dependent splitter in order to reduce the difference between the wavelength of the input optical signal and the characteristic wavelength.

2. The device of claim 1, wherein the control loop comprises a Proportional Integral (PI) controller configured to receive and process an error signal indicating the difference between the wavelength of the optical signal and the characteristic wavelength, and to output the control signal in response, and
wherein the control signal comprises a voltage signal for controlling the tuning element to automatically tune the characteristic wavelength of the wavelength dependent splitter to the wavelength of the input optical signal.

3. The device of claim 2, wherein the PI controller comprises:
an amplifier that receives and amplifies the error signal;
an integrating logic device that performs an integration function on the amplified error signal over time to provide an integrated error signal; and
an adder configured to add the amplified error signal and the integrated error signal to output the control signal.

4. The device of claim 1, wherein the first optical coupler splits the optical signal such that the reference optical signal is less than or equal to approximately 5 percent of the optical signal.

5. The device of claim 1, wherein at least the wavelength dependent splitter and the tuning element are in an optical cavity of a tunable laser.

6. The device of claim 1, wherein the first output optical signal output from the first output of the wavelength dependent splitter is substantially equal to zero when the characteristic wavelength matches the wavelength of the input optical signal, indicating the wavelength dependent splitter is in tune.

7. The device of claim 1, wherein the wavelength dependent splitter comprises a ring filter.

8. The device of claim 7, wherein the input of the wavelength dependent splitter comprises an input optical waveguide, the first output comprises an output bus, and the second output comprises an output drop for outputting the filtered portion of the input optical signal.

9. The device of claim 1, further comprising:
a phase shifter connected to the first optical coupler for phase shifting the reference optical signal with respect to the input optical signal.

10. The device of claim 1, further comprising:
a storage device for storing reference values of the ratio of the first photocurrent and input optical power of the optical signal, when the wavelength dependent splitter is in resonance, such that the characteristic wavelength is equal to the wavelength of the optical signal, wherein the control loop is configured to provide the control signal, at least in part, by determining a difference between a value of the ratio of the first photocurrent provided by the first photodiode and the input optical power, and the stored reference value.

11. The device of claim 1, further comprising:
a second photodiode configured to detect a second coupled optical signal provided by the second optical coupler and to provide a corresponding second photocurrent,
wherein the control loop further comprises an adder configured to determine a difference between the first photocurrent and the second photocurrent, and to provide an error signal indicating the difference, the control loop providing the control signal based, at least in part, on the error signal from the adder.

12. The device of claim 11, wherein the wavelength dependent splitter is in resonance with the input optical signal when the error signal is equal to zero.

13. A tunable filter device for filtering an optical signal, comprising:
a first ring filter comprising a first input, a first output bus and a first output drop;
a first tuning element configured to tune a first characteristic wavelength of the first ring filter;
a first optical coupler configured to split the optical signal into (i) an input optical signal that is input to the first ring filter via the first input and (ii) a first reference optical signal;
a second optical coupler configured to combine the first reference optical signal with a band stop filtered optical signal, output from the first output bus of the first ring filter, to provide a first coupled optical signal and a second coupled optical signal;
a first pair of photodiodes configured to detect the first and second coupled optical signals, respectively, and to provide corresponding first and second photocurrents; and
a first control loop comprising:
a first adder configured to determine a difference between the first photocurrent and the second photocurrent, and to provide first error signal indicating the difference; and
a first control circuit configured to provide a first control signal, based at least in part on the first error signal, for controlling the first tuning element to automatically tune the first characteristic wavelength of the first ring filter to substantially equal a wavelength of the input optical signal, wherein the first characteristic wavelength of the first ring filter corresponds to a maximum of a wavelength dependent ratio of input optical power of the input optical signal and output optical power of a band pass filtered optical signal from the first output drop.

14. The device of claim 13, further comprising:
a second ring filter comprising a second input, a second output bus and a second output drop;
a second tuning element configured to tune a second characteristic wavelength of the second ring filter;
a third optical coupler configured to split the band pass filtered optical signal from the first output drop of the first ring filter into (i) another input optical signal that is input to the second ring filter via the second input and (ii) a second reference optical signal;
a fourth optical coupler configured to combine the second reference optical signal with a band stop filtered optical signal, output from the second output bus of the second ring filter, to provide a third coupled optical signal and a fourth coupled optical signal;
a second pair of photodiodes configured to detect the third and fourth coupled optical signals, respectively, and to provide corresponding third and fourth photocurrents; and
a second control loop comprising:
a second adder configured to determine a difference between the third photocurrent and the fourth photocurrent, and to provide second error signal indicating the difference; and
a second control circuit configured to provide a second control signal, based at least in part on the second error signal, for controlling the second tuning element to automatically tune the second characteristic wavelength of the second ring filter to substantially equal a wavelength of the another input optical signal, wherein the second characteristic wavelength of the second ring filter corresponds to a maximum of a wavelength dependent ratio of input optical power of the another input optical signal and output optical power of a band pass filtered optical signal from the second output drop.

15. The device of claim 14, wherein each of the first and second control loops comprises:
a Proportional Integral Derivative (PID) controller configured to perform a control function on a portion of the first and second error signals, respectively, to output the first and second control signals.

16. A tunable filter device for filtering an optical signal, the filter device comprising:
a first filter bank comprising:
a first ring filter configured to receive a first input optical signal corresponding to a portion of the optical signal, the first ring filter having a first tuning element for tuning a first characteristic wavelength of the first ring filter, wherein the first characteristic wavelength corresponds to a maximum of a wavelength dependent ratio of input optical power of the optical signal and output optical power of a band pass filtered optical signal output by the first ring filter; and
a first control loop configured to provide a first control signal, based at least in part on a first reference signal corresponding to a reflected portion of the first input optical signal, that controls the first tuning element to automatically tune the first characteristic wavelength of the first ring filter to a wavelength of the optical signal;
a second filter bank comprising:
a second ring filter configured to receive a second input optical signal corresponding to a portion of the optical signal, the second ring filter having a second tuning element for tuning a second characteristic wavelength of the second ring filter, wherein the second characteristic wavelength corresponds to a maximum of a wavelength dependent ratio of input optical power of the optical signal and output optical power of a band pass filtered optical signal output by the second ring filter; and
a second control loop, independent of the first control loop, configured to provide a second control signal, based at least in part on a second reference signal corresponding to a reflected portion of the second input optical signal, that controls the second tuning element to automatically tune the second characteristic wavelength of the second ring filter to a wavelength of the optical signal;
an input optical switch configured to switch the optical signal between the first filter bank and the second filter bank to select an active filter bank, such that the second filter bank is reset when the first filter bank is selected as the active filter bank, and the first filter bank is reset when the second filter bank is selected as the active filter bank by switching the input optical switch; and
an output optical switch configured to switch between the first filter bank and the second filter bank, in correspondence with the input optical switch, such that the band pass filtered optical signal output by one of the first ring filter in the first filter bank and the second ring filter in the second filter bank is output from the tunable filter device, respectively.

17. The tunable filter device of claim 16, wherein the first ring filter in the first filter bank is tuned to a corresponding next free spectral range when the second filter bank is the active filter bank, and wherein the second ring filter in the second filter bank is tuned to a corresponding next free spectral range when the first filter bank is the active filter bank.

18. The tunable filter device of claim 16, further comprising:
a first blocking optical switch located at an output drop of the first ring filter in the first filter bank, the first blocking optical switch blocking the band pass filtered optical signal output by the first ring filter when the second filter bank is the active filter bank; and
a second blocking optical switch located at an output drop of the second ring filter in the second filter bank, the second blocking optical switch blocking the band pass filtered optical signal output by the second ring filter when the first filter bank is the active filter bank.

19. The tunable filter device of claim 16, wherein:
the first filter bank further comprises:
a third ring filter configured to receive the band pass filtered optical signal output by the first ring filter, the third ring filter having a third tuning element for tuning a third characteristic wavelength of the third ring filter, wherein the third characteristic wavelength corresponds to a maximum of a wavelength dependent ratio of input optical power of the band pass filtered optical signal output by the first ring filter and output optical power of a band pass filtered optical signal output by the third ring filter, and wherein the third ring filter has a different diameter than the first ring filter; and a third control loop configured to provide a third control signal, based at least in part on a third reference signal corresponding to a portion of the band pass filtered optical signal output by the first ring filter, that controls the third tuning element to automatically tune the third characteristic wavelength of the third ring filter to a wavelength of the band pass filtered optical signal output by the first ring filter; and the second filter bank further comprises:

a fourth ring filter configured to receive the band pass filtered optical signal output by the second ring filter, the fourth ring filter having a fourth tuning element for tuning a fourth characteristic wavelength of the fourth ring filter, wherein the fourth characteristic wavelength corresponds to a maximum of a wavelength dependent ratio of input optical power of the band pass filtered optical signal output by the second ring filter and output optical power of a band pass filtered optical signal output by the fourth ring filter, and wherein the fourth ring filter has a different diameter than the second ring filter; and a fourth control loop configured to provide a fourth control signal, based at least in part on a fourth reference signal corresponding to a portion of the band pass filtered optical signal output by the second ring filter, that controls the fourth tuning element to automatically tune the fourth characteristic wavelength of the fourth ring filter to a wavelength of the band pass filtered optical signal output by the second ring filter.

20. The tunable filter device of claim 19, wherein:

the first filter bank further comprises:

a first input optical coupler configured to split the optical signal into the first reference signal and the first input optical signal that is input to the first ring filter;

a first output optical coupler configured to combine the first reference signal with a first band stop filtered optical signal from the first ring filter to provide first coupled optical signals, the first control loop providing the first control signal, based at least in part, on a difference between the first coupled optical signals;

a second input optical coupler configured to split the band pass filtered optical signal output of the first ring filter into the third reference signal and a third input optical signal that is input to the third ring filter; and a second output optical coupler configured to combine the third reference signal with a third band stop filtered optical signal from the third ring filter to provide second coupled optical signals, the third control loop providing the third control signal, based at least in part, on a difference between the second coupled optical signals; and the second filter bank further comprises:

a third input optical coupler configured to split the optical signal into the second reference signal and the second input optical signal that is input to the second ring filter;

a third output optical coupler configured to combine the second reference signal with a second band stop filtered optical signal from the second ring filter to provide third coupled optical signals, the second control loop providing the second control signal, based at least in part, on a difference between the third coupled optical signals;

a fourth input optical coupler configured to split the band pass filtered optical signal output of the second ring filter into the fourth reference signal and a fourth input optical signal that is input to the fourth ring filter; and a fourth output optical coupler configured to combine the fourth reference signal with a fourth band stop filtered optical signal from the fourth ring filter to provide fourth coupled optical signals, the fourth control loop providing the fourth control signal, based at least in part, on a difference between the fourth coupled optical signals.

* * * * *